US011335786B2

(12) United States Patent
Wu et al.

(10) Patent No.: US 11,335,786 B2
(45) Date of Patent: May 17, 2022

(54) GATE STRUCTURE IN HIGH-κ METAL GATE TECHNOLOGY

(71) Applicant: Taiwan Semiconductor Manufacturing Co., Ltd., Hsin-Chu (TW)

(72) Inventors: Wei Cheng Wu, Zhubei (TW); Alexander Kalnitsky, San Francisco, CA (US); Shih-Hao Lo, Zhubei (TW); Hung-Pin Ko, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 6 days.

(21) Appl. No.: 16/580,296

(22) Filed: Sep. 24, 2019

(65) Prior Publication Data

US 2020/0251566 A1 Aug. 6, 2020

Related U.S. Application Data

(60) Provisional application No. 62/799,939, filed on Feb. 1, 2019.

(51) Int. Cl.
*H01L 29/49* (2006.01)
*H01L 29/423* (2006.01)
*H01L 29/66* (2006.01)

(52) U.S. Cl.
CPC .. *H01L 29/42376* (2013.01); *H01L 29/66545* (2013.01); *H01L 29/66553* (2013.01)

(58) Field of Classification Search
CPC . H01L 29/49; H01L 29/4925; H01L 29/4933; H01L 29/4958; H01L 29/6656
See application file for complete search history.

(56) References Cited

U.S. PATENT DOCUMENTS

| 9,847,347 B1* | 12/2017 | Smith | H01L 29/66772 |
| 2011/0081774 A1* | 4/2011 | Yeh | H01L 29/40114 438/591 |
| 2011/0147858 A1 | 6/2011 | Lim et al. | |
| 2011/0309434 A1* | 12/2011 | Huang | H01L 29/518 257/326 |
| 2014/0319620 A1* | 10/2014 | Hoentschel | H01L 29/66606 257/379 |
| 2015/0050787 A1 | 2/2015 | Flachowsky et al. | |
| 2016/0225871 A1 | 8/2016 | Cheng et al. | |

* cited by examiner

*Primary Examiner* — Hoai V Pham
(74) *Attorney, Agent, or Firm* — Eschweiler & Potashnik, LLC

(57) ABSTRACT

Various embodiments of the present disclosure are directed towards a semiconductor device including a gate structure. The semiconductor device further includes a pair of spacer segments on a semiconductor substrate. A high-κ gate dielectric structure overlies the semiconductor substrate. The high-κ gate dielectric structure is laterally between and borders the spacer segments. The gate structure overlies the high-k gate dielectric structure and has a top surface about even with a top surface of the spacer segments. The gate structure includes a metal structure and a gate body layer. The gate body layer has a top surface that is vertically offset from a top surface of the metal structure and further has a lower portion cupped by the metal structure.

20 Claims, 12 Drawing Sheets

GATE STRUCTURE IN HIGH-κ METAL GATE TECHNOLOGY

REFERENCE TO RELATED APPLICATION

This application claims the benefit of U.S. Provisional Application No. 62/799,939, filed on Feb. 1, 2019, the contents of which are incorporated by reference in their entirety.

BACKGROUND

Many modern-day electronic devices contain metal-oxide-semiconductor field-effect transistors (MOSFETs). A MOSFET has a gate structure arranged over a substrate between a source region and a drain region. A voltage applied to a gate electrode of the gate structure determines the conductivity of the MOSFET. High-κ metal gate (HKMG) technology is a promising candidate for next generation MOSFET devices due to advantages with scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
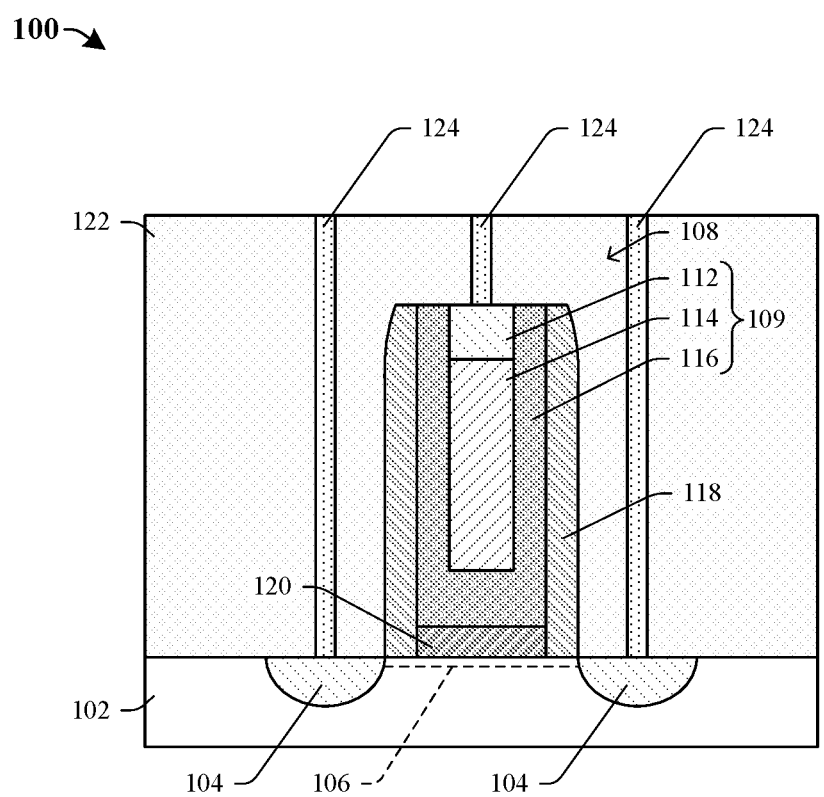
FIG. 1 illustrates a cross-sectional view of some embodiments of a semiconductor device including a work function structure surrounding a silicide layer and overlying a high-κ gate dielectric structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Over the last two decades, MOSFETs have typically used gate structures comprising polysilicon. In recent years, high-κ metal gate (HKMG) metal-oxide-semiconductor field-effect transistors (MOSFETs) have begun to see widespread use due to improved performance and scaling. In some embodiments, during fabrication of a gate electrode of a HKMG transistor, a dummy gate structure is formed on a substrate and source and drain regions are formed respectively along opposite sidewalls of the dummy gate structure. The dummy gate structure comprises a dummy gate electrode, and further comprises a high-κ gate dielectric layer underlying the dummy gate electrode. An inter-level dielectric (ILD) structure is formed covering the dummy gate structure and a first planarization process (e.g., a chemical mechanical planarization (CMP) process) is performed into the ILD structure until the dummy gate structure is exposed. The dummy gate electrode is removed, thereby exposing the high-κ gate dielectric layer, and a stack of metal layers is formed covering the ILD structure and lining an opening resulting from removal. A second planarization process is performed to remove a portion of the stack of metal layers outside the opening. An etch process is performed to etch back a top surface of the stack of metal layers and to partially clear the opening. A polysilicon layer is formed filling the opening over the stack of metal layers. A third planarization process is performed to remove a portion of the polysilicon layer outside the opening, and a remaining portion of the polysilicon layer is silicided, thereby forming a silicide layer over the stack of metal layers. This, in part, defines the gate electrode of the HKMG transistor. Conductive contacts are disposed over the silicide layer and also over the source and drain regions. Overlying metal wires are subsequently formed within an interconnect dielectric structure over the conductive contacts.

A challenge with the above method is in a complexity of the method, which includes at least three planarization processes and an etch process for the formation of the gate electrode. Further, it has been appreciated that the above structure may present a number of practical difficulties. For example, a thickness and shape of the silicide layer may increase a gate resistance of the HKMG transistor, thereby decreasing a performance of the HKMG transistor. Additionally, in yet another example, the stack of metal layers may limit scaling of the gate electrode, such that scaling of the HKMG transistor may be impeded (e.g., unable to scale a length of the gate electrode to less than about 26 nanometers).

In some embodiments, the present disclosure relates to a method that simplifies the fabrication of the gate electrode of the HKMG transistor by reducing the number of planarization and etch processes used during the fabrication. For example, after removing a dummy gate electrode and defining an opening, a gate electrode of a HKMG transistor may be fabricated by depositing a stack of metal layers and a polysilicon layer in the opening. Removal of the dummy gate electrode comprises performing a first planarization process (e.g., a CMP process). The opening is defined over the high-κ gate dielectric layer and between inner sidewalls of a sidewall spacer. The polysilicon layer covers the stack of metal layers and has a downward protrusion extending into the opening and cupped by the stack of metal layers. A silicide process is performed to partially consume the polysilicon layer and to form a silicide layer with a downward protrusion surrounded by the stack of metal layers. A second planarization process (e.g., a CMP process) is performed into the silicide layer and the stack of metal layers to remove a portion of the silicide layer and a portion of the stack of metal layers outside the opening, thereby defining the gate electrode. Therefore, the disclosed method uses two planarization process to form the gate electrode, thereby reducing fabrication costs of the HKMG transistor.

In further embodiments, the present disclosure relates to an improved structure of the gate electrode of the HKMG transistor that reduces the gate resistance. For example, a T-shaped electrode structure overlies a U-shaped stack of metal layers, such that a lower portion of the T-shaped electrode structure is surrounded by the U-shaped stack of metal layers. Additionally, a thickness of an upper portion of the T-shaped electrode structure is large to reduce gate resistance and increase performance of the HKMG transistor. Further, the large thickness of the upper portion of the T-shaped electrode structure facilitates shrinking the gate electrode (e.g., shrinking a length of the gate electrode to less than about 26 nanometers). This, in part, increases an ability to scale the HKMG transistor and/or increases a number of HKMG transistors disposed on a single silicon wafer.

With reference to FIG. 1, a cross-sectional view of some embodiments of a semiconductor device 100 including a transistor 108 with a gate structure 109.

The transistor 108 overlies a substrate 102 and comprises the gate structure 109, a high-κ gate dielectric structure 120, a sidewall spacer 118, and source/drain regions 104. The gate structure 109 overlies the high-κ gate dielectric structure 120. The sidewall spacer 118 surrounds the gate structure 109 and the high-κ gate dielectric structure 120. The source/drain regions 104 are disposed within the substrate 102 on opposite sides of the transistor 108. A selectively-conductive channel 106 is in the substrate 102, laterally between the source/drain regions 104. In some embodiments, the source/drain regions 104 and the selectively-conductive channel 106 are doped regions of the substrate 102 having opposite doping types. For example, the selectively-conductive channel 106 may be p-type and the source/drain regions 104 may be n-type, or vice versa. In some embodiments, the transistor 108 may be configured as a high-κ metal gate (HKMG) metal-oxide-semiconductor field-effect transistor (MOSFET).

An inter-level dielectric (ILD) structure 122 overlies the transistor 108. A plurality of conductive vias 124 extend through the ILD structure 122. The conductive vias 124 overlie the gate structure 109 and the source/drain regions 104. The high-κ gate dielectric structure 120 includes one or more dielectric layer(s) with one or more high-κ dielectric material(s). As used herein, a high-κ dielectric material is a dielectric material with a dielectric constant greater than 3.9. The gate structure 109 includes a silicide layer 112, a gate body layer 114 underlying the silicide layer 112, and a work function structure 116 (in some embodiments, referred to as a stack of metal layers) wrapped around the silicide layer 112 and the gate body layer 114. In some embodiments, the gate body layer 114 is a polysilicon layer. The work function structure 116 may, for example, comprise one or more metal layer(s).

In some embodiments, outer sidewalls of the silicide layer 112 and outer sidewalls of the gate body layer 114 are aligned. Additionally, the outer sidewalls of the silicide layer 112 and the outer sidewalls of the gate body layer 114 are in direct contact with inner sidewalls of the work function structure 116. A top surface of the silicide layer 112 and a top surface of the work function structure 116 are substantially aligned.

By wrapping the work function structure 116 around outer sidewalls of the silicide layer 112 and aligning the top surface of the silicide layer 112 with the top surface of the work function structure 116, fabrication of the transistor 108 may be simplified. For example, formation of the silicide layer 112 and formation of the work function structure 116 may comprise a single planarization process (e.g., a single chemical mechanical planarization (CMP) process). By simplifying the fabrication of the transistor 108, cost and time associated with formation of the semiconductor device 100 may be reduced.

Figure 2:
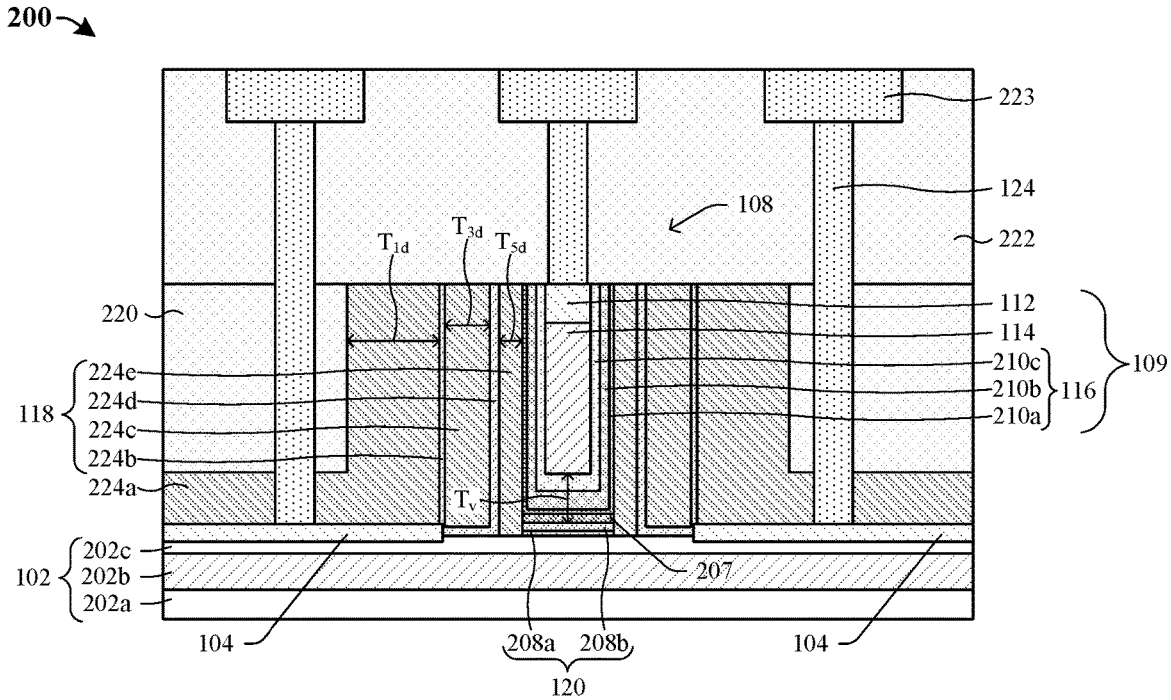
FIG. 2 illustrates a cross-sectional view of some more detailed embodiments of the semiconductor device of FIG. 1 in which the work function structure comprises a stack of metal layers and the high-κ gate dielectric structure comprises a stack of dielectric layers.

With reference to FIG. 2, a cross-sectional view of a semiconductor device 200 according to some alternative embodiments of the semiconductor device 100 of FIG. 1 is provided. The high-κ gate dielectric structure 120 comprises a stack of dielectric layers 208a-b and the work function structure 116 comprises a stack of metal layers 210a-c.

In some embodiments, the substrate 102 may, for example, have a first doping type (e.g., p-type). In some embodiments, the substrate 102 may, for example, be a bulk substrate (e.g., a bulk silicon substrate), a silicon-on-insulator (SOI) substrate, or some other suitable substrate. For example, the substrate 102 may comprise a device layer 202c, an insulator layer 202b underlying the device layer 202c, and a handle substrate 202a underlying the insulator layer 202b. In the aforementioned example, the substrate 102 is configured as an SOI substrate. The device layer 202c may, for example, be or comprise silicon, such as, for example, monocrystalline silicon, amorphous silicon, bulk silicon, or the like. Further, the device layer 202c may, for example, have the first doping type. The insulator layer 202b may, for example, be an oxide, such as silicon oxide. The handle substrate 202a may, for example, be or comprise silicon, such as monocrystalline silicon, amorphous silicon, bulk silicon, or the like.

The source/drain regions 104 are epitaxial layers overlying the substrate 102. The source/drain regions 104 have a second doping type (e.g., n-type) opposite the first doping type. The source/drain regions 104 have a top surface disposed above a top surface of the substrate 102 and have a bottom surface disposed below the top surface of the substrate 102. In some embodiments, the source/drain regions 104 may be ion implanted regions of the device layer 202c comprising the second doping type. In further embodiments, a silicide layer (not shown) may be disposed between the source/drain regions 104 and the overlying conductive vias 124. In yet further embodiments, lightly doped regions (e.g., having a doping concentration less than the source/drain regions) (not shown) are disposed laterally between the high-κ gate dielectric structure 120 and respectively the source/drain regions 104. The lightly doped regions may, for example, be epitaxial layers and/or discrete doped regions of the device layer 202c comprising the second doping type. In some embodiments, isolation structures may be disposed in the substrate 102 at outermost regions of the source/drain regions 104 to electrically isolate the transistor 108 from adjacent devices on the substrate 102 (not shown).

The high-κ gate dielectric structure 120 comprises the stack of dielectric layers 208a-b. The stack of dielectric layers 208a-b may respectively, for example, be or comprise a high-κ dielectric material, such as silicon oxynitride, hafnium oxide, hafnium oxynitride, hafnium aluminum oxide, zirconium oxide, or the like. As used herein, a high-κ dielectric material is a dielectric material with a dielectric constant greater than 3.9. In some embodiments, the stack of dielectric layers 208a-b may respectively be or comprise dielectric materials different from one another. In some embodiments, a first gate dielectric layer 208a overlies the substrate 102 and a second gate dielectric layer 208b overlies the first gate dielectric layer 208a.

The work function structure 116 comprises the stack of metal layers 210a-c. The stack of metal layers 210a-c may respectively, for example, be or comprise a metal material, such as titanium, titanium nitride, titanium aluminum, or the like. In some embodiments, the stack of metal layers 210a-c may respectively be or comprise metal materials different from one another. For example, a first metal layer 210a may be or comprise titanium, a second metal layer 210b may be or comprise titanium nitride, and/or a third metal layer 210c may be or comprise titanium aluminum. The work function structure 116 has a vertical thickness $T_v$ defined between a top surface of the high-κ gate dielectric structure 120 and a bottom surface of the gate body layer 114. In some embodiments, the vertical thickness $T_v$ may be within a range of approximately 4 to 40 nanometers. In some embodiments, if the vertical thickness $T_v$ is greater than 4 nanometers, then a resistance of the gate structure 109 may be reduced while maintaining a structural integrity of the gate structure 109. In further embodiments, if the vertical thickness $T_v$ is less than 40 nanometers, then the resistance of the gate structure 109 may be reduced while reducing costs associated with formation of the work function structure 116. In further embodiments, an intermediate metal layer 207 is disposed between the work function structure 116 and the high-κ gate dielectric structure 120. In some embodiments, the intermediate metal layer 207 is a part of the work function structure 116. In such embodiments, the intermediate metal layer 207 may, for example, be or comprise a metal material, such as titanium, titanium nitride, titanium aluminum, or the like and/or have a thickness within a range of 1 to 10 nanometers. In some embodiments, the reduced resistance of the gate structure 109 may, for example, reduce substrate and/or radio frequency (RF) losses.

In some embodiments in which the source/drain regions 104 are n-type, the gate body layer 114 is n-type polysilicon, the work function structure 116 comprises metal(s) with n-type work function(s), or some other suitable conductive material with an n-type work function. As used herein, a metal with an n-type work function may be or comprise, for example, hafnium, zirconium, titanium, tantalum, aluminum, some other suitable n-type work function metal(s), or any combination of the foregoing. In some embodiments in which the source/drain regions 104 are p-type, the gate body layer 114 is p-type polysilicon, the work function structure 116 comprises metal(s) with p-type work function(s), or some other suitable conductive material with an p-type work function. As used herein, a metal with a p-type work function may be, for example, ruthenium, palladium, platinum, cobalt, nickel, titanium aluminum nitride, tungsten carbon nitride, some other suitable p-type work function metal(s), or any combination of the foregoing.

In some embodiments, the stack of metal layers 210a-c respectively may have thickness different from one another. For example, the first metal layer 210a may have a thickness less than a thickness of the second metal layer 210b. The third metal layer 210c may have a thickness less than the thickness of the second metal layer 210b and greater than the thickness of the first metal layer 210a. Each metal layer in the stack of metal layers 210a-c may respectively have a thickness within a range of about 1 to 10 nanometers. The work function structure 116 has a U-shape, such that each metal layer 210a-c respectively has a U-shape. In yet further embodiments, the intermediate metal layer 207 may have a thickness less than the third metal layer 210c.

The gate body layer 114 is disposed within a center of the U-shaped work function structure 116. Thus, the work function structure 116 wraps around sidewalls of the gate body layer 114 and cups an underside of the gate body layer 114. The gate body layer 114 may, for example, be or comprise polysilicon. In the aforementioned example, the polysilicon may be doped such that the gate body layer 114 forms an ohmic contact with the work function structure 116 and the silicide layer 112. For example, the gate body layer 114 may comprise the second doping type (e.g., n-type) with a doping concentration greater than $1*10^{19}$ atoms/cm$^3$. The doped polysilicon may, for example, decrease a gate resistance of the gate structure 109, thereby decreasing a power consumption of the transistor 108. In further embodiments, the gate body layer 114 may, for example, be or comprise intrinsic (i.e., undoped) polysilicon. The silicide layer 112 may, for example, be or comprise nickel silicide, cobalt silicide, titanium silicide, copper silicide, or the like. In some embodiments, a thickness of the gate body layer 114 may be four times or greater than a thickness of the silicide layer 112. The silicide layer 112 is configured to electrically couple an overlying conductive via 124 to the work function structure 116. In some embodiments, outer sidewalls of the silicide layer 112 are aligned with outer sidewalls of the gate body layer 114. In some embodiments, the thickness of the silicide layer 112 is less than the vertical thickness $T_v$.

The sidewall spacer 118 comprises a plurality of spacer dielectric layers 224b-c. A contact etch stop layer (CESL) 224a surrounds a first spacer dielectric spacer layer 224b. In some embodiments, the CESL 224a, a second spacer dielectric layer 224c, and a fourth spacer dielectric layer 224e may respectively be or comprise a same dielectric material. The same dielectric material may, for example, be or comprise silicon nitride, silicon carbide, or the like. The CESL 224a has a first dielectric thickness $T_{1d}$ within a range of about 10 to 20 nanometers. The second spacer dielectric layer 224c has a third dielectric thickness $T_{3d}$ within a range of about 10 to 30 nanometers. The fourth spacer dielectric layer 224e has a fifth dielectric thickness $T_{5d}$ within a range of about 3 to 5 nanometers. In some embodiments, the first spacer dielectric layer 224b and a third spacer dielectric layer 224d may respectively be or comprise another same dielectric material. The another same dielectric material may, for example, be or comprise an oxide such as silicon oxide, or the like. In further embodiments, the first and third spacer dielectric layers 224b, 224d are a single continuous dielectric layer having a U-shape. The single continuous dielectric layer may wrap around sidewalls of the second spacer dielectric layer 224c and cup an underside of the second spacer dielectric layer 224c.

A first ILD layer 220 overlies the CESL 224a. A second ILD layer 222 overlies the transistor 108 and the first ILD layer 220. The conductive vias 124 extend from conductive wires 223 through the second ILD layer 222 to electrically couple the silicide layer 112 and the source/drain regions 104 to overlying metal layers (e.g., conductive layers in an overlying interconnect structure) and/or other semiconductor devices (e.g., a memory cell) (not shown). In some embodiments, the first and second ILD layers 220, 222 may, for example, respectively be or comprise a low-κ dielectric material, silicon oxide, or the like. As used herein, a low-κ dielectric material is a dielectric material with a dielectric constant less than 3.9. The conductive vias 124 may, for example, respectively be or comprise aluminum, copper, or the like. The conductive wires 223 may, for example, respectively be or comprise aluminum copper, or the like.

Figure 3A:
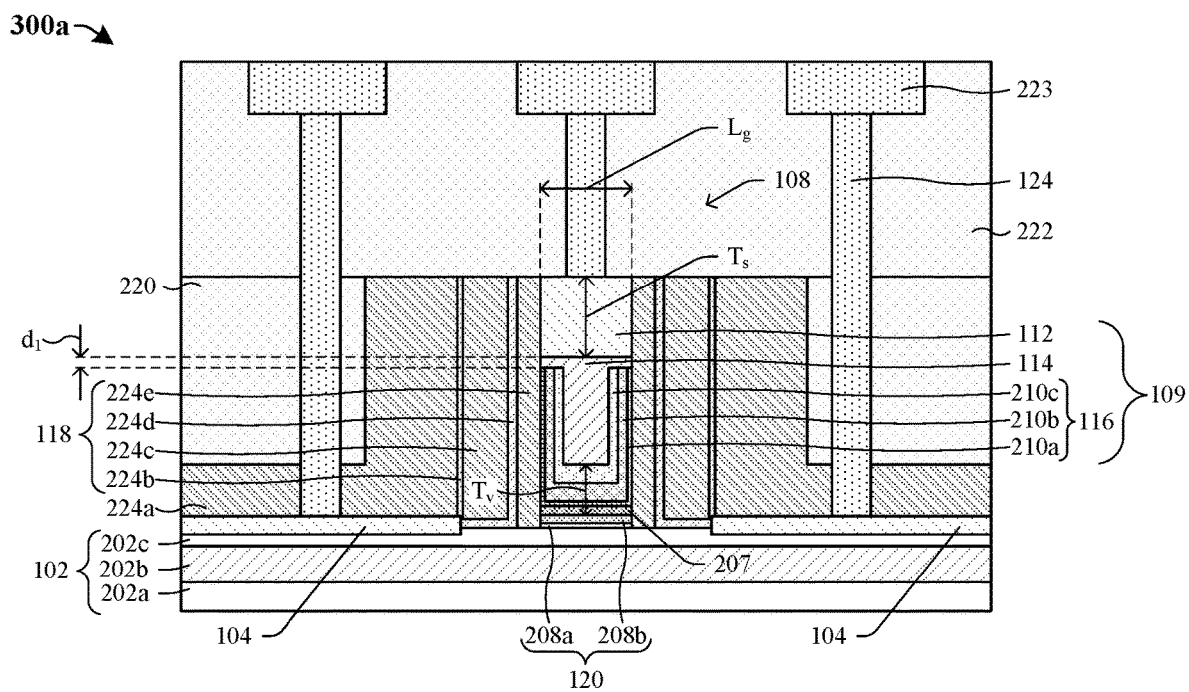
FIGS. 3A-3C illustrate various cross-sectional views of some alternative embodiments of the semiconductor device of FIG. 2.

With reference to FIG. 3A, a cross-sectional view of a semiconductor device 300a according to some alternative embodiments of the semiconductor device 200 of FIG. 2 is provided, in which the gate body layer 114 has a T-shape.

The gate body layer 114 has a T-shape such that a top surface of the gate body layer 114 is vertically above the top surface of the work function structure 116 by a distance $d_1$. In some embodiments, the distance $d_1$ may be within a range of about 1 to 10 nanometers. Thus, the work function structure 116 wraps around outer sidewalls of the gate body layer 114 and cups an underside of the gate body layer 114. An upper portion of the gate body layer 114 overhands the work function structure 116. Outer sidewalls of the silicide layer 112 are aligned with the outer sidewalls of the work function structure 116. A thickness $T_s$ of the silicide layer 112 is greater than the thickness $T_v$ of the work function structure 116.

In some embodiments, the thickness $T_s$ of the silicide layer 112 is within a range of about 5 to 30 nanometers. In some embodiments, if the thickness $T_s$ is greater than 5 nanometers, then a gate resistance of the gate structure 109 is reduced. In further embodiments, if the thickness $T_s$ is less than 30 nanometers then the gate resistance of the gate structure 109 is reduced while mitigating damage to a structure of the semiconductor device 300a during a silicide process used to form the silicide layer 112. Aligning outer sidewalls of the silicide layer 112 with outer sidewalls of the work function structure 116 facilitates reduction of a length $L_g$ of the gate structure 109. By virtue of the profile of the silicide layer 112, the length $L_g$ may be reduced to less than 26 nanometers, thereby increasing an ability to scale the transistor 108 and/or increases a number of transistors 108 disposed on a single silicon wafer.

Figure 3B:
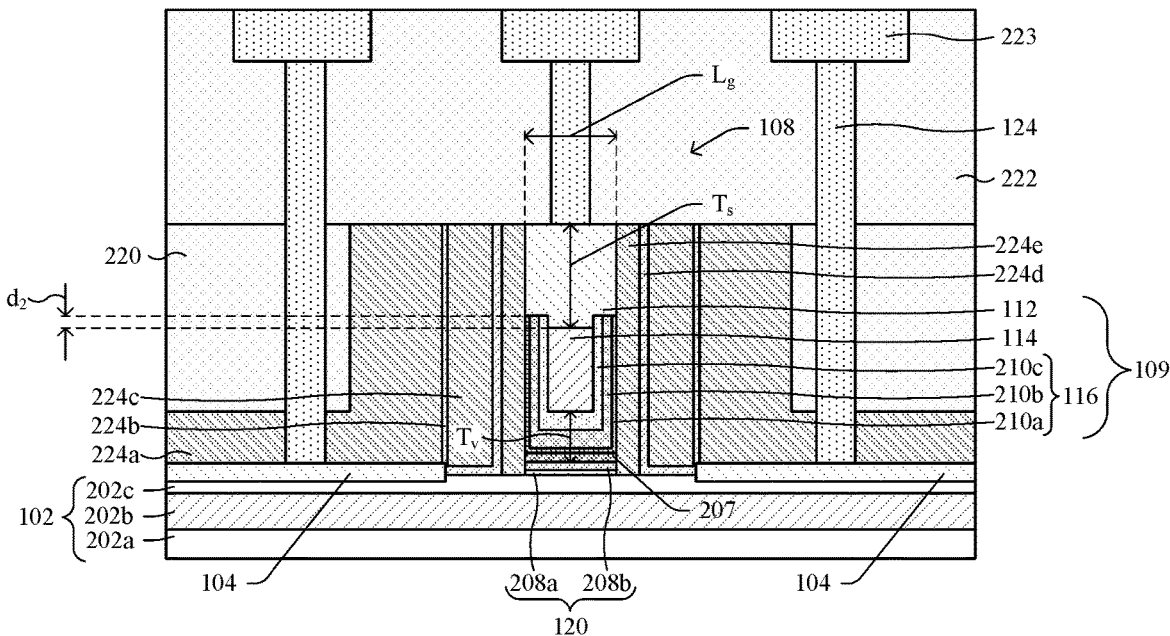

With reference to FIG. 3B, a cross-sectional view of a semiconductor device 300b according to some alternative embodiments of the semiconductor device 200 of FIG. 2 is provided. A bottom surface of the silicide layer 112 is below a top surface of the work function structure 116 by a distance $d_2$. In some embodiments, the distance $d_2$ may be within a range of about 1 to 10 nanometers. The silicide layer 112 has a T-shape. Thus, the work function structure 116 wraps around outer sidewalls of a protrusion of the silicide layer 112.

Figure 3C:
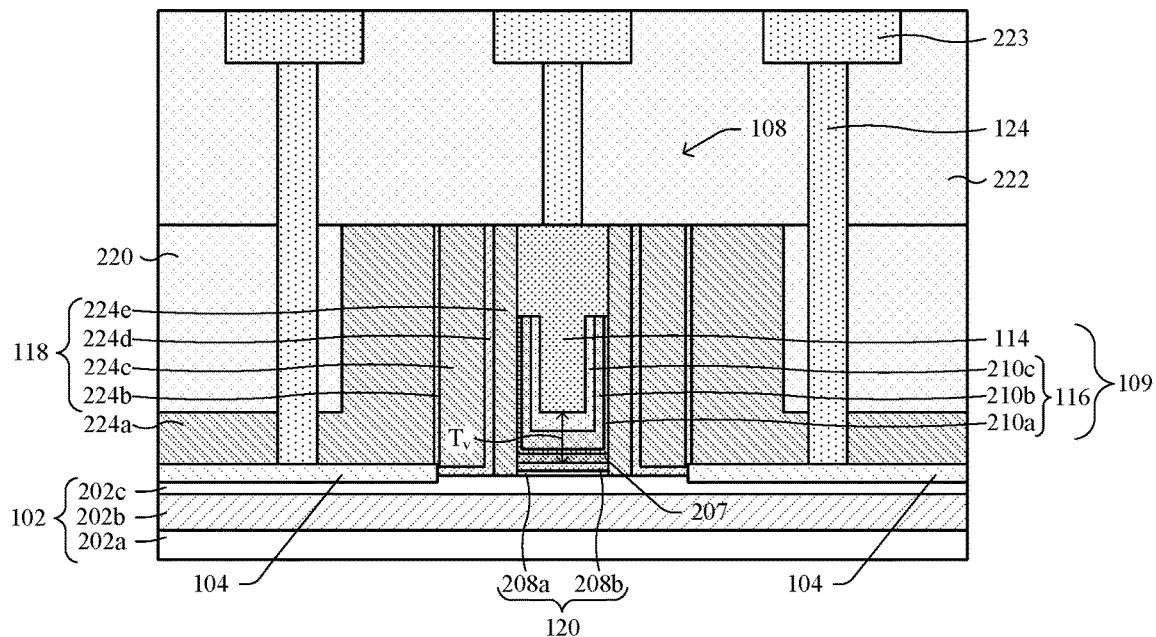

With reference to FIG. 3C, a cross-sectional view of a semiconductor device 300c according to some alternative embodiments of the semiconductor device 200 of FIG. 2 is provided. The gate body layer 114 extends from an upper surface of the sidewall spacer 118 to an upper surface of the work function structure 116. The gate body layer 114 has a top surface that is vertically offset from a top surface of the work function structure 116 and further has a downward protrusion cupped by the work function structure 116. In some embodiments, the gate body layer 114 is a single material. The single material may, for example, be or comprise aluminum or some other suitable material.

FIGS. 4-9 illustrate cross-sectional views 400-900 of some embodiments of a first method of forming a semiconductor device including a high-κ metal gate (HKMG) structure with a silicide layer according to aspects of the present disclosure. Although the cross-sectional views 400-900 shown in FIGS. 4-9 are described with reference to a method, it will be appreciated that the structures shown in FIGS. 4-9 are not limited to the method but rather may stand alone separate of the method. Furthermore, although FIGS. 4-9 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 4-9 may, for example, be employed to form the semiconductor device 200 of FIG. 2.

Figure 4:
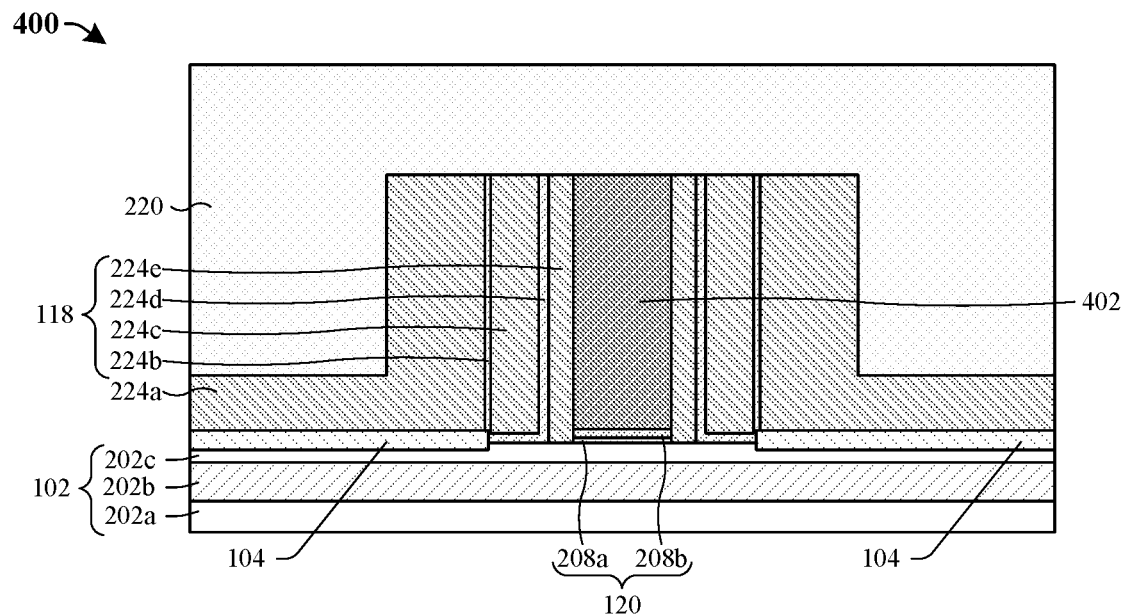
FIGS. 4-9 illustrate cross-sectional views of various embodiments of a first method of forming a semiconductor device including a work function structure surrounding a silicide layer and overlying a high-κ gate dielectric structure.

As shown in cross-sectional view 400 of FIG. 4, a dummy gate electrode structure 402 overlying a substrate 102 is provided. In some embodiments, a method for forming the structure of FIG. 4 may comprise forming the high-κ gate dielectric structure 120 over the substrate 102. The dummy gate electrode structure 402 is formed over the high-κ gate dielectric structure 120. After forming the dummy gate electrode structure 402, the source/drain regions 104 may be epitaxially formed over the substrate 102. In alternative embodiments, the source/drain regions 104 may be formed in the substrate 102 by a doping process. The sidewall spacer 118 may be formed around the dummy gate electrode structure 402 and the high-κ gate dielectric structure 120. The contact etch stop layer (CESL) 224a may be formed around the sidewall spacer 118. The first inter-level dielectric (ILD) layer 220 is formed over the sidewall spacer 118, the dummy gate electrode structure 402, and the CESL 224a.

Figure 5:
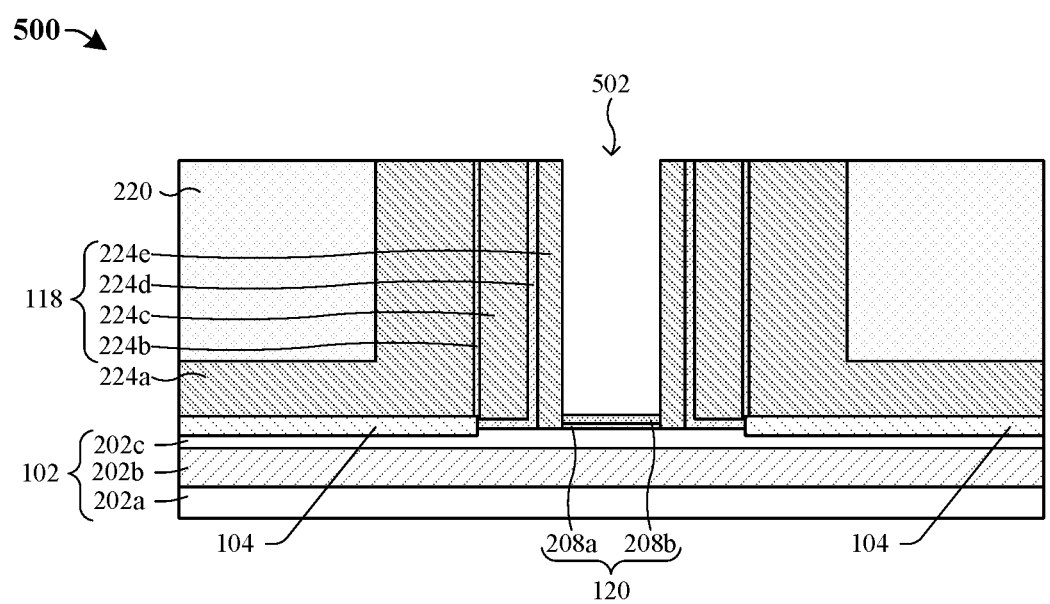

As shown in cross-sectional view 500 of FIG. 5, the dummy gate electrode structure (402 of FIG. 4) is removed, thereby defining an opening 502 above the high-κ gate dielectric structure 120. In some embodiments, before removing the dummy gate electrode structure (402 of FIG. 4), a planarization process (e.g., a chemical mechanical planarization (CMP) process) is performed into the first ILD layer 220. The planarization process is performed until an upper surface of the sidewall spacer 118 and an upper surface of the dummy gate electrode structure (402 of FIG. 4) are exposed. The dummy gate electrode structure (402 of FIG. 4) may be removed by: forming a masking layer (not shown) over the structure of FIG. 4, performing an etch process according to the masking layer, thus defining the opening 502, and subsequently removing the masking layer.

Figure 6:
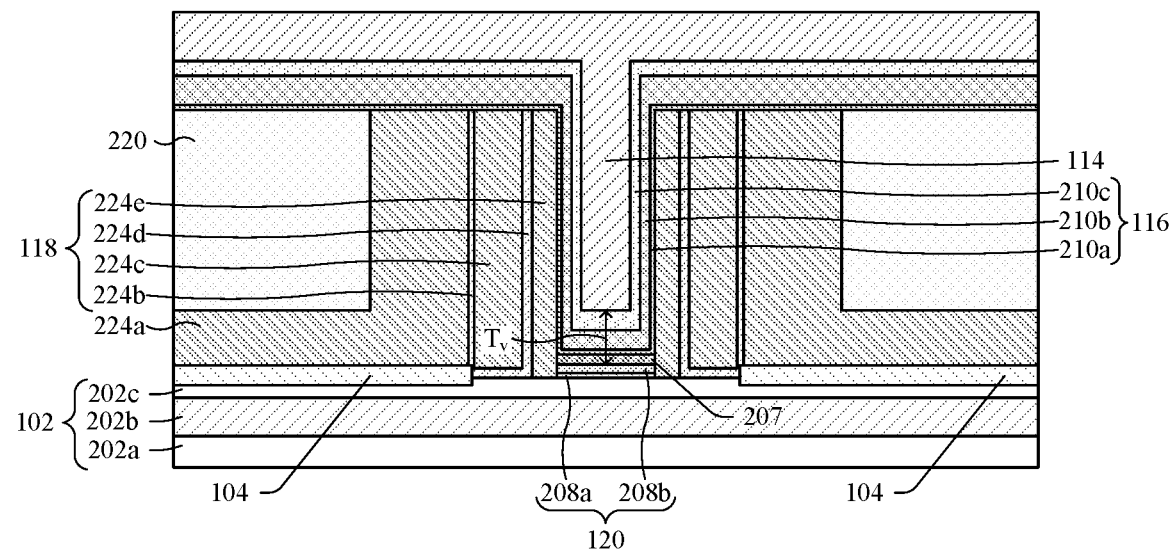

As shown in cross-sectional view 600 of FIG. 6, a work function structure 116, an intermediate metal layer 207, and a gate body layer 114 are formed over the structure of FIG. 5. The work function structure 116 lines the opening (502 of FIG. 5). The gate body layer 114 comprises a protrusion protruding into the opening (502 of FIG. 5) and cupped by the work function structure 116. The work function structure 116 and the intermediate metal layer 207 have a vertical thickness $T_v$ defined between a top surface of the high-κ gate dielectric structure 120 and a bottom surface of the gate body layer 114. In some embodiments the vertical thickness $T_v$ may be within a range of approximately 4 to 40 nanometers. In some embodiments, the gate body layer 114 may, for example, be or comprise a single material such as polysilicon. In the aforementioned embodiment, the polysilicon may be doped with a second doping type (e.g., n-type). In some embodiments, an ion implantation process may be performed on the gate body layer 114 to implant the second doping type into the polysilicon.

Figure 7:
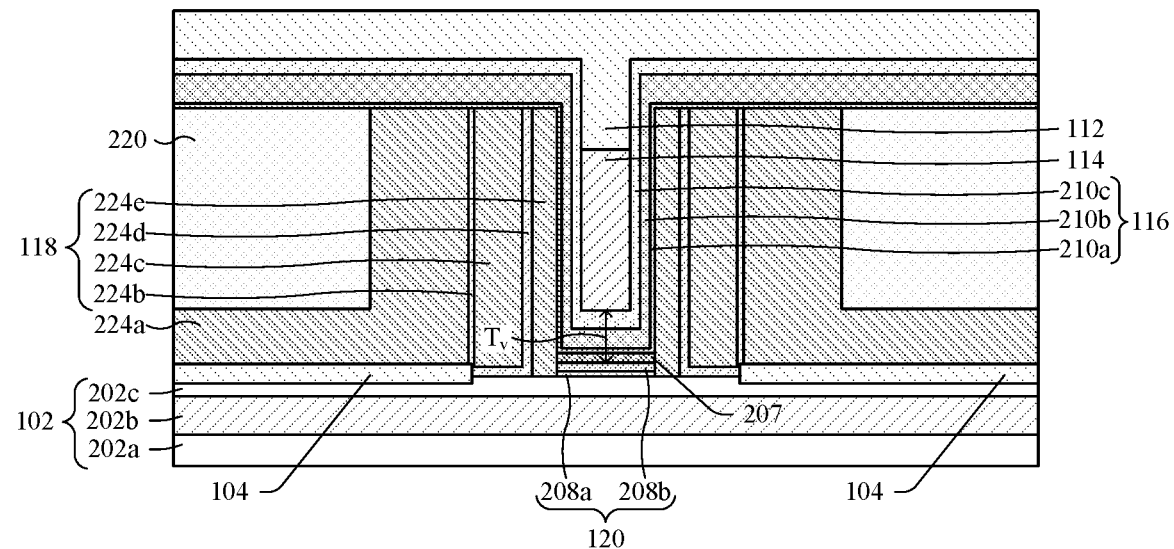

As shown in cross-sectional view 700 of FIG. 7, a silicide process is performed to convert a portion of the gate body layer 114 into a silicide layer 112. In some embodiments, the silicide process includes forming a conductive layer (not shown) over the structure of FIG. 6, and subsequently performing an annealing process to convert the conductive layer and the portion of the gate body layer 114 into the silicide layer 112. A bottom surface of the silicide layer 112 extends below a top surface of the sidewall spacer 118.

Figure 8:
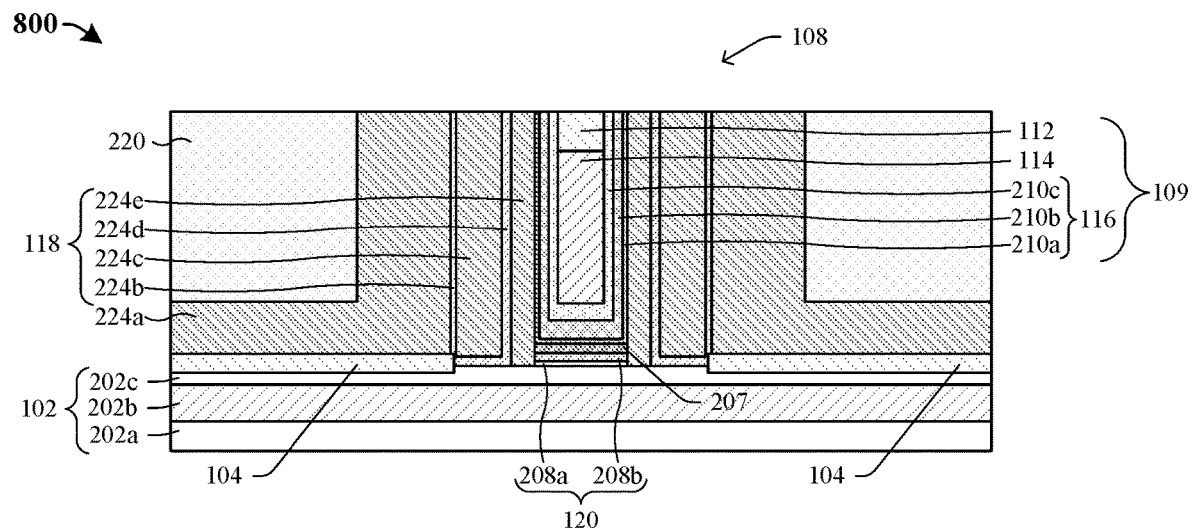

As shown in cross-sectional view 800 of FIG. 8, a planarization process (e.g., a CMP process) is performed into the structure of FIG. 7 until the upper surface of the sidewall spacer 118 is reached. This, in part, defines a gate structure 109 over the high-κ gate dielectric structure 120 and further, in part, defines a transistor 108 comprising the gate structure 109. Therefore, in some embodiments, the transistor 108 may be formed by using two planarization processes. This, in part, reduces fabrication cost and time associated with forming the transistor 108.

Figure 9:
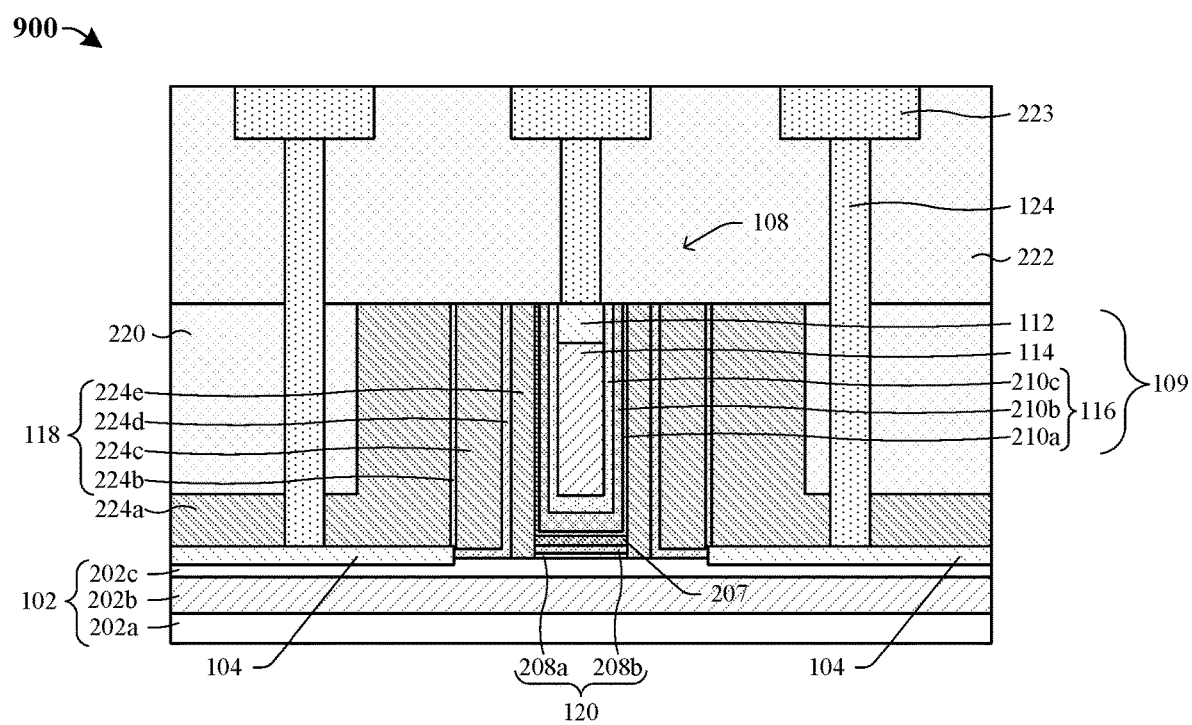

As shown in cross-sectional view 900 of FIG. 9, a second ILD layer 222 is formed over the first ILD layer 220. Conductive vias 124 and conductive wires 223 are formed over the source/drain regions 104 and the silicide layer 112.

Figure 10:
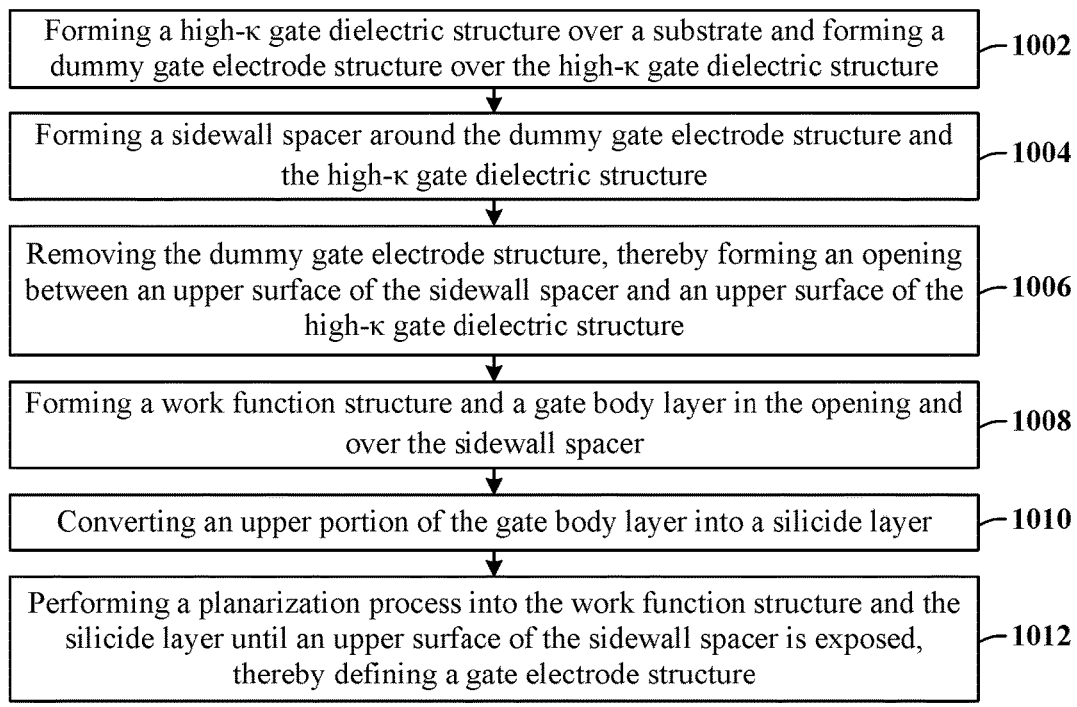
FIG. 10 illustrates a methodology in flowchart format that illustrates some embodiments of the first method of forming the semiconductor device including a work function structure surrounding a silicide layer and overlying a high-κ gate dielectric structure.

FIG. 10 illustrates a method 1000 of forming a semiconductor device including a high-κ metal gate (HKMG) structure with a silicide layer according to the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. In some embodiments, the method 1000 relates to the first method of FIGS. 4-9.

At act 1002, a high-κ gate dielectric structure is formed over a substrate and a dummy gate electrode structure is formed over the high-κ gate dielectric structure. FIG. 4 illustrates a cross-sectional view 400 corresponding to some embodiments of act 1002.

At act 1004, a sidewall spacer is formed around the dummy gate electrode structure and the high-κ gate dielectric structure. FIG. 4 illustrates a cross-sectional view 400 corresponding to some embodiments of act 1004.

At act 1006, the dummy gate electrode structure is removed, thereby forming an opening between an upper surface of the sidewall spacer and an upper surface of the high-κ gate dielectric structure. FIG. 5 illustrates a cross-sectional view 500 corresponding to some embodiments of act 1006.

At act 1008, a work function structure and a gate body layer are formed in the opening and over the sidewall spacer. FIG. 6 illustrates a cross-sectional view 600 corresponding to some embodiments of act 1008.

At act 1010, an upper portion of the gate body layer is converted into a silicide layer. FIG. 7 illustrates a cross-sectional view 700 corresponding to some embodiments of act 1010.

At act 1012, a planarization process is performed into the work function structure and the silicide layer until an upper surface of the sidewall spacer is exposed, thereby defining a gate electrode structure. FIG. 8 illustrates a cross-sectional view 800 corresponding to some embodiments of act 1012.

FIGS. 11-18 illustrate cross-sectional views 1100-1800 of some embodiments of a second method of forming a semiconductor device including a high-κ metal gate (HKMG) structure according to aspects of the present disclosure. Although the cross-sectional views 1100-1800 shown in FIGS. 11-18 are described with reference to a method, it will be appreciated that the structures shown in FIGS. 11-18 are not limited to the method but rather may stand alone separate of the method. Furthermore, although FIGS. 11-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part. In some embodiments, FIGS. 11-18 may, for example, be employed to form the semiconductor device 300a of FIG. 3A.

Figure 11:
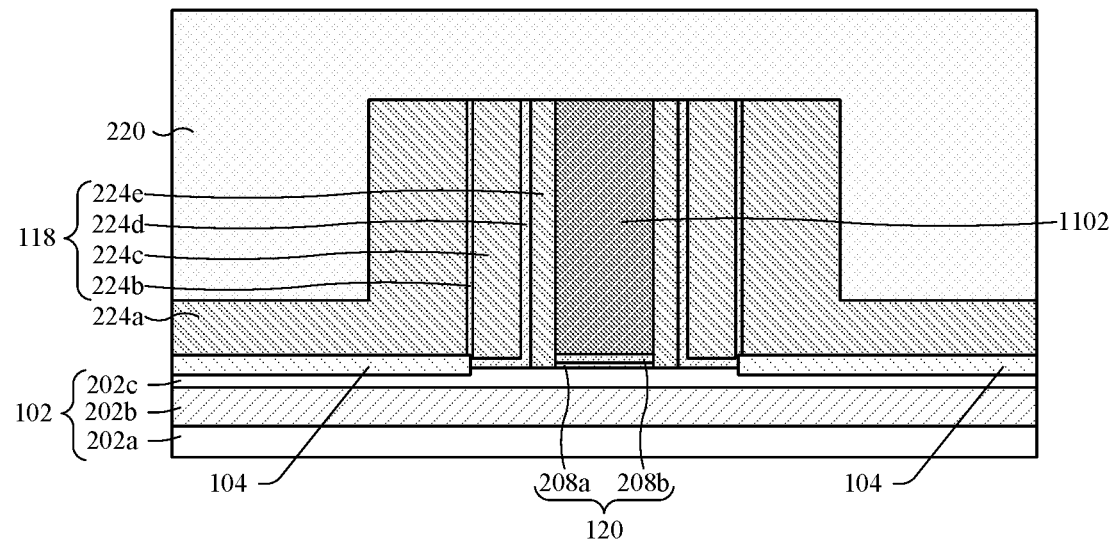
FIGS. 11-18 illustrate cross-sectional views of various embodiments of a second method of forming a semiconductor device including a gate structure overlying a high-κ gate dielectric structure.

As shown in cross-sectional view 1100 of FIG. 11, a dummy gate electrode structure 1102 overlying a substrate 102 is provided. In some embodiments, a method for forming the structure of FIG. 11 may comprise forming the high-κ gate dielectric structure 120 over the substrate 102. The dummy gate electrode structure 1102 is formed over the high-κ gate dielectric structure 120. After forming the dummy gate electrode structure 1102, the source/drain regions 104 may be epitaxially formed over the substrate 102. In alternative embodiments, the source/drain regions 104 may be formed in the substrate 102 by a doping process. The sidewall spacer 118 may be formed around the dummy gate electrode structure 1102 and the high-κ gate dielectric structure 120. The contact etch stop layer (CESL) 224a may be formed around the sidewall spacer 118. The first inter-level dielectric (ILD) layer 220 is formed over the sidewall spacer 118, the dummy gate electrode structure 1102, and the CESL 224a.

Figure 12:
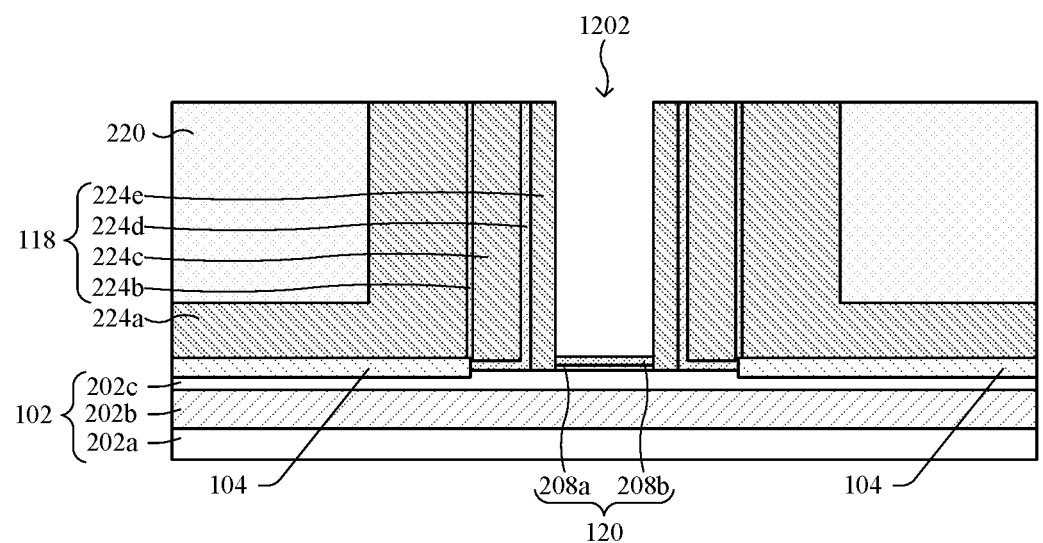

As shown in cross-sectional view 1200 of FIG. 12, the dummy gate electrode structure (1102 of FIG. 11) is removed, thereby defining a first opening 1202 above the high-κ gate dielectric structure 120. In some embodiments, before removing the dummy gate electrode structure (1102 of FIG. 11), a planarization process (e.g., a CMP process) is performed into the first ILD layer 220. The planarization process is performed until an upper surface of the sidewall spacer 118 and an upper surface of the dummy gate electrode structure (1102 of FIG. 11) are exposed. The dummy gate electrode structure (1102 of FIG. 11) may be removed by: forming a masking layer (not shown) over the structure of FIG. 11, performing an etch process according to the masking layer, thus defining the first opening 1202, and subsequently removing the masking layer.

Figure 13:
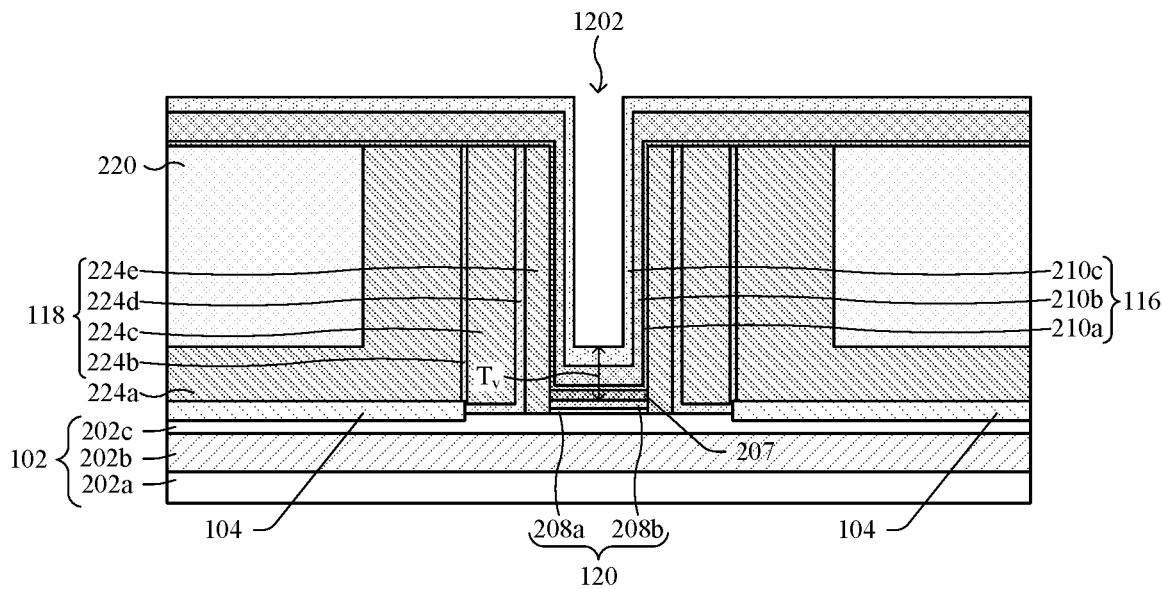

As shown in cross-sectional view 1300 of FIG. 13, a work function structure 116 and an intermediate metal layer 207 are formed over the structure of FIG. 12. The work function structure 116 lines a portion the first opening 1202 and directly contacts inner sidewalls of the sidewall spacer 118. The work function structure 116 and the intermediate metal layer 207 have a vertical thickness $T_v$ defined between a top surface of the high-κ gate dielectric structure 120 and an upper surface of the work function structure 116. In some embodiments the vertical thickness $T_v$ may be within a range of approximately 4 to 40 nanometers.

Figure 14:
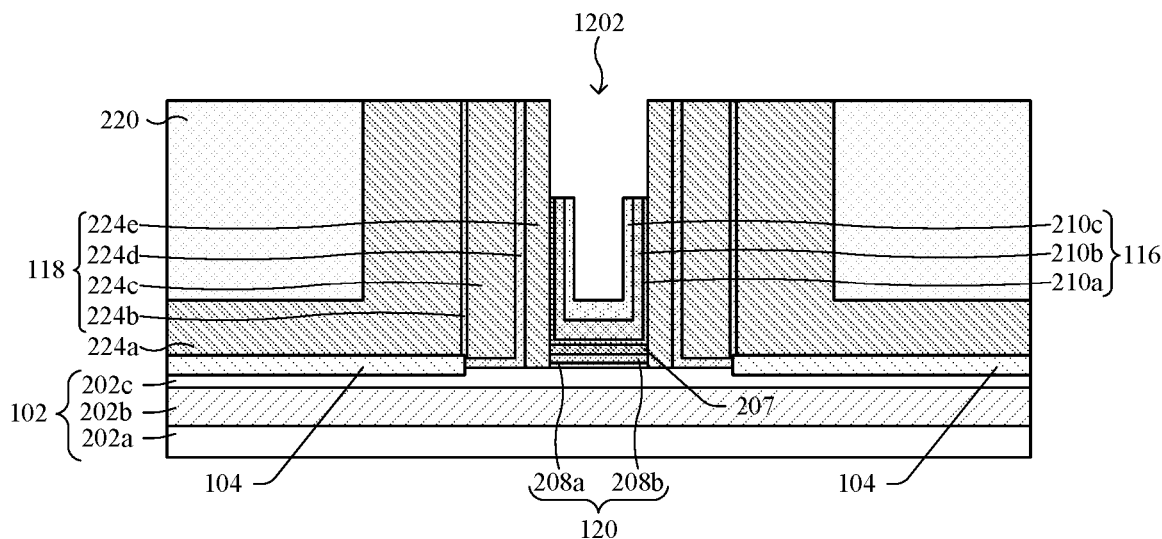

As shown in cross-sectional view 1400 of FIG. 14, an etching process is performed on the work function structure 116, thereby exposing a portion of the inner sidewalls of the sidewall spacer 118. A top surface of the work function structure 116 is disposed below the upper surface of the sidewall spacer 118.

Figure 15:
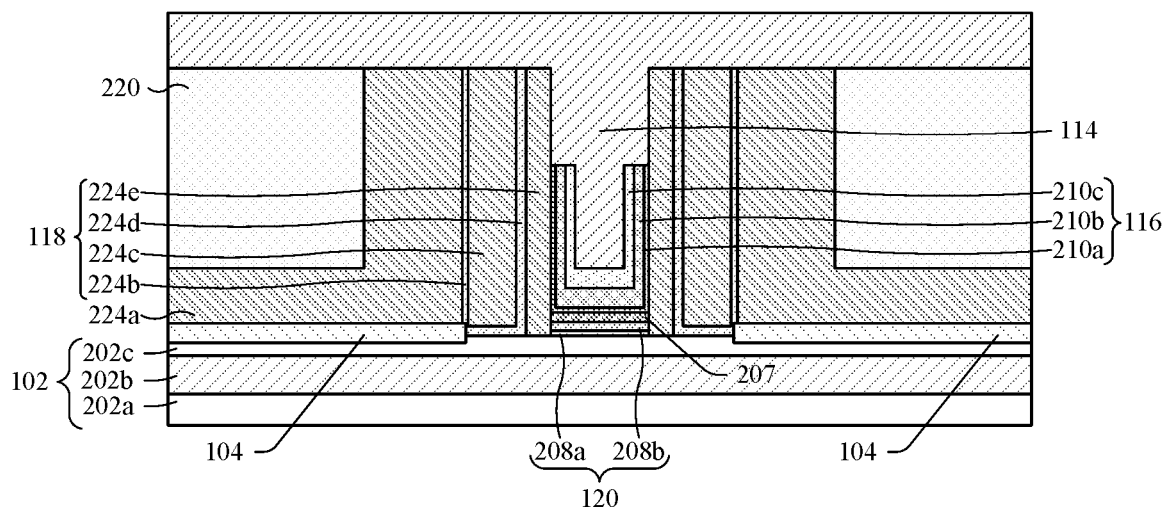

As shown in cross-sectional view 1500 of FIG. 15, a gate body layer 114 is formed over the sidewall spacer 118 and the work function structure 116, thereby filling the first opening (1202 of FIG. 12). In some embodiments, the gate body layer 114 may, for example, be or comprise a single material such as polysilicon. In the aforementioned embodiment, the polysilicon may be doped with a second doping type (e.g., n-type). In some embodiments, an ion implantation process may be performed on the gate body layer 114 to implant the second doping type into the polysilicon.

Figure 16:
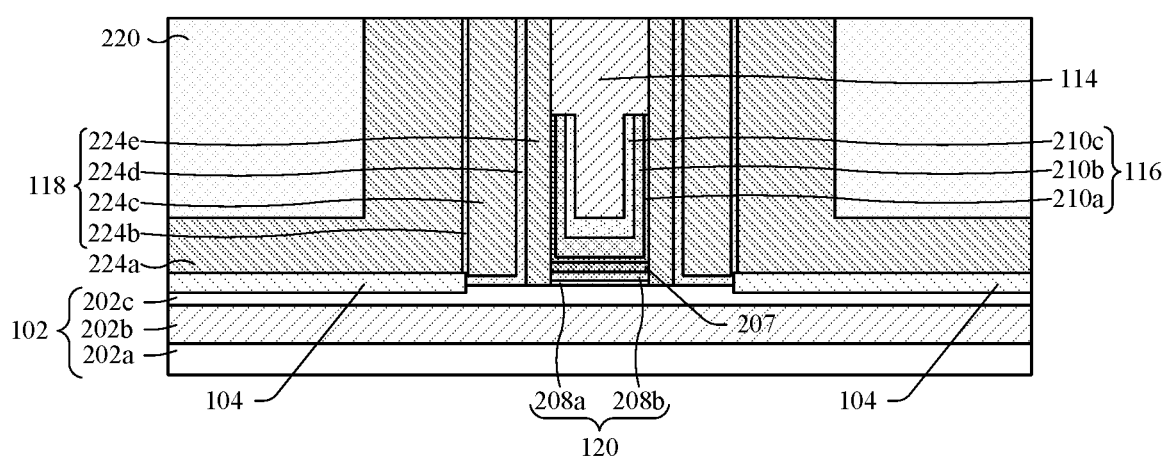

As shown in cross-sectional view 1600 of FIG. 16, a planarization process (e.g., a CMP process) is performed on the structure of FIG. 15. In some embodiments, the planarization process is performed into the gate body layer 114 until the upper surface of the sidewall spacer 118 is exposed.

Figure 17:
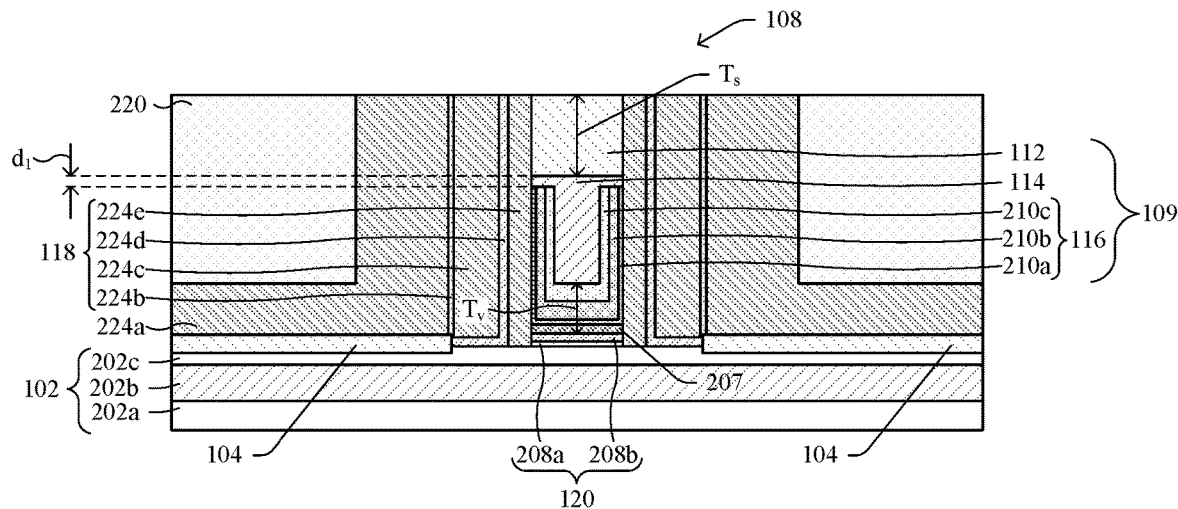

As shown in cross-sectional view 1700 of FIG. 17, a silicide process is performed on the structure of FIG. 16 to convert a portion of the gate body layer 114 into a silicide layer 112, thereby defining a gate structure 109. In some embodiments, the silicide process includes forming a conductive layer (not shown) over the structure of FIG. 16, and subsequently performing an annealing process to convert the conductive layer and the portion of the gate body layer 114 into the silicide layer 112. The gate body layer 114 has a T-shape such that a top surface of the gate body layer 114 is vertically above the top surface of the work function structure 116 by a distance $d_1$. In some embodiments, the distance $d_1$ may be within a range of about 1 to 10 nanometers. In alternative embodiments, a top surface of the gate body layer 114 is vertically below the top surface of the work function structure 116 (see, e.g., FIG. 3B). A thickness $T_s$ of the silicide layer 112 is greater than the thickness $T_v$ of the work function structure 116. In some embodiments, the silicide process is performed such that the thickness $T_s$ of the silicide layer 112 is within a range of about 5 to 30 nanometers.

Figure 18:
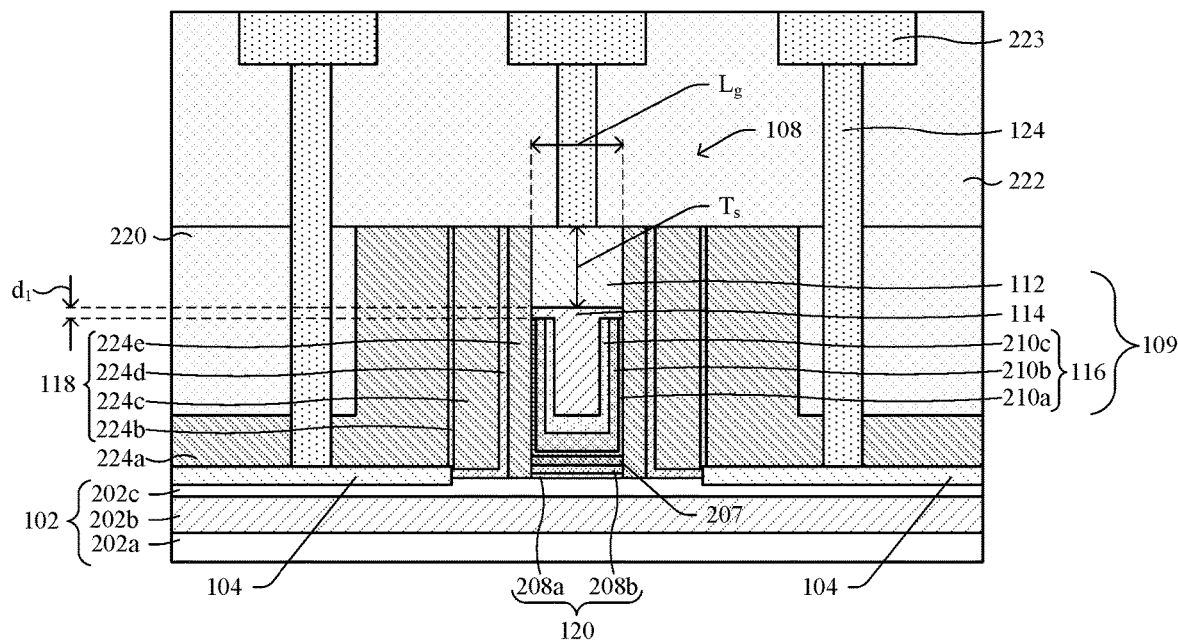

As shown in cross-sectional view 1800 of FIG. 18, a second ILD layer 222 is formed over the first ILD layer 220. Conductive vias 124 and conductive wires 223 are formed over the source/drain regions 104 and the silicide layer 112.

In some embodiments, the second method of FIGS. 11-18 may be altered to form the semiconductor device 300c of FIG. 3C. For example, at FIG. 15, the gate body layer 114 may be formed such that the gate body layer 114 is a single material and is or comprises aluminum or some other suitable metal. In the aforementioned example, the silicide process performed at FIG. 17 may be omitted, such that the gate structure 109 is defined after performing the planarization process of FIG. 16. By simplifying the fabrication of the gate structure 109, cost and time associated with formation of the semiconductor device 300c of FIG. 3C may be reduced. In some embodiments, the gate body layer 114 is formed in such a manner that outer sidewalls of the gate body layer 114 are aligned with outer sidewalls of the work function structure 116. This, in part, facilities formation of the gate body layer 114 around inner sidewalls of the work function structure 116 and over the top surface of the work function structure 116. By virtue of the profile of the gate body layer, the length $L_g$ of the gate structure 109 may be reduce, for example, to less than 26 nanometers.

Figure 19:
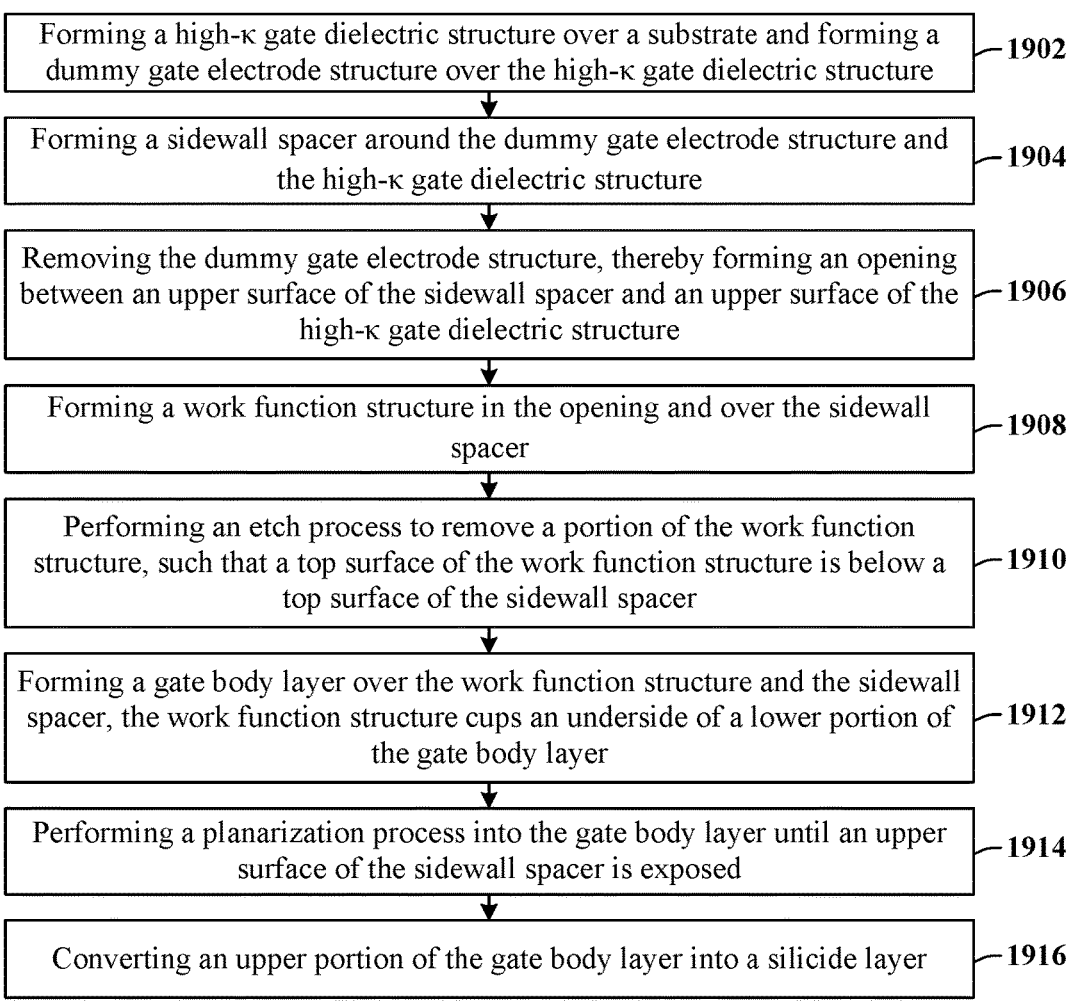
FIG. 19 illustrates a methodology in flowchart format that illustrates some embodiments of the second method of forming the semiconductor device including a gate structure overlying a high-κ gate dielectric structure.

FIG. 19 illustrates a method 1900 of forming a semiconductor device including a high-κ metal gate (HKMG) structure according to the present disclosure. Although the method 1900 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. In some embodiments, the method 1900 relates to the second method of FIGS. 11-18.

At act 1902, a high-κ gate dielectric structure is formed over a substrate and a dummy gate electrode structure is formed over the high-κ gate dielectric structure. FIG. 11 illustrates a cross-sectional view 1100 corresponding to some embodiments of act 1902.

At act 1904, a sidewall spacer is formed around the dummy gate electrode structure and the high-κ gate dielectric structure. FIG. 11 illustrates a cross-sectional view 1100 corresponding to some embodiments of act 1904.

At act 1906, the dummy gate electrode structure is removed, thereby forming an opening between an upper surface of the sidewall spacer and an upper surface of the high-κ gate dielectric structure. FIG. 12 illustrates a cross-sectional view 1200 corresponding to some embodiments of act 1906.

At act 1908, a work function structure is formed in the opening and over the sidewall spacer. FIG. 13 illustrates a cross-sectional view 1300 corresponding to some embodiments of act 1908.

At act 1910, an etching process is performed to remove a portion of the work function structure, such that a top surface of the work function structure is below a top surface of the sidewall spacer. FIG. 14 illustrates a cross-sectional view 1400 corresponding to some embodiments of act 1910.

At act 1912, a gate body layer is formed over the work function structure and the sidewall spacer, such that the work function structure cups an underside of a lower portion of the gate body layer. FIG. 15 illustrates a cross-sectional view 1500 corresponding to some embodiments of act 1912.

At act 1914, a planarization process is performed into the gate body layer until an upper surface of the sidewall spacer is exposed. FIG. 16 illustrates a cross-sectional view 1600 corresponding to some embodiments of act 1914.

At act 1916, an upper portion of the gate body layer is converted into a silicide layer. FIG. 17 illustrates a cross-sectional view 1700 corresponding to some embodiments of act 1916.

Accordingly, in some embodiments, the present application provides a method for forming a transistor that includes a gate structure including a silicide layer and a gate body layer surrounded by a work function structure with two planarization processes. In further embodiments, the present application provides a transistor that includes a gate structure comprising a gate body layer and a work function structure. The gate body layer has a top surface that is vertically offset from a top surface of the work function structure and further has a lower portion cupped by the work function structure.

In some embodiments, the present application provides a semiconductor device including a pair of spacer segments on a semiconductor substrate; a high-κ gate dielectric structure overlying the semiconductor substrate, wherein the high-κ gate dielectric structure is laterally between and borders the spacer segments; and a gate structure over the high-k gate dielectric structure and having a top surface about even with top surface of the spacer segments, wherein the gate structure includes a metal structure and a gate body layer, wherein the gate body layer has a top surface that is vertically offset from a top surface of the metal structure and further has a lower portion cupped by the metal structure.

In some embodiments, the present application provides a semiconductor device including a pair of source/drain regions in a semiconductor substrate; a high-κ gate dielectric structure overlying the semiconductor substrate, wherein the high-k gate dielectric structure is laterally between and borders the source/drain regions; and a gate structure overlying the high-κ gate dielectric structure, wherein the gate structure includes a gate body layer and a silicide layer that are stacked, wherein the gate structure further includes a work function structure wrapping around a bottom of the gate body layer and extending along sidewalls of the gate body and silicide layers to a top surface of the work function structure, and wherein the top surface of the work function structure is about even with a top surface of the silicide layer.

In some embodiments, the present application provides a method for manufacturing a semiconductor device, the method including forming a dummy gate structure over a semiconductor substrate, wherein the dummy gate structure includes a high-κ gate dielectric structure overlying the semiconductor substrate and further includes a dummy gate electrode overlying the high-κ gate dielectric structure, and wherein a sidewall spacer surrounds the dummy gate structure; replacing the dummy gate electrode with a stack of gate electrode layers, wherein the stack of gate electrode layers includes metal layers and a polysilicon layer overlying the metal layers; converting an upper portion of the polysilicon layer into a silicide layer; and performing a planarization process into the stack of gate electrode layers and the silicide layer until an upper surface of the sidewall spacer is exposed, thereby defining a gate electrode structure, wherein the planarization process partially removes the silicide layer.

In some embodiments, the present application provides a method for manufacturing a semiconductor device, the method including forming a dummy gate structure over a semiconductor substrate, wherein the dummy gate structure includes a high-κ gate dielectric structure overlying the semiconductor substrate and further including a dummy gate electrode over the high-κ gate dielectric structure, and wherein a sidewall spacer surrounds the dummy gate structure; replacing the dummy gate electrode with a stack of metal layers, such that the stack of metal layers overlies the high-κ gate dielectric structure and the sidewall spacer; performing an etching process to remove a portion of the stack of metal layers overlying the sidewall spacers and to recess a top surface of the stack of metal layers to below a top surface of the sidewall spacer; and forming a gate body over the stack of metal layers, wherein a lower portion of the gate body is surrounded by the stack of metal layers and an upper portion of the gate body overhangs the stack of metal layers. In some embodiments, wherein the forming of the gate body includes forming a polysilicon layer over the stack of metal layers and the sidewall spacer, wherein the polysilicon layer has a lower portion surrounded by the stack of metal layers; performing a planarization process into the polysilicon layer until the top surface of the sidewall spacer is exposed; forming a conductive layer over the polysilicon layer; and performing an annealing process on the polysilicon layer and the conductive layer, thereby converting an upper portion of the poly silicon layer into a silicide layer, wherein outer sidewalls of the silicide layer are aligned with outer sidewalls of the stack of metal layers. In some embodiments, the silicide layer continuously extends from the top surface of the sidewall spacer to a point below the top surface of the stack of metal layers. In some embodiments, a bottom surface of the silicide layer is above a top surface of the stack of metal layers and the silicide layer is separated from the stack of metal layers by the polysilicon layer. In some embodiments, the forming of the gate body includes forming a conductive layer over the stack of metal layers and the sidewall spacer, wherein the conductive layer includes a single material; and performing a planarization process into the conductive layer until a top surface of the sidewall spacer is exposed. In some embodiments, the single material is aluminum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a sidewall spacer on a semiconductor substrate, wherein the sidewall spacer comprises a first dielectric layer and a second dielectric layer;
    a high-κ gate dielectric structure overlying the semiconductor substrate, wherein the high-κ gate dielectric structure is laterally between opposing sidewalls of the sidewall spacer ;
    a gate structure over the high-κ gate dielectric structure and having a top surface about even with a top surface of the sidewall spacer, wherein the gate structure comprises a metal structure and a gate body layer, wherein the gate body layer has a top surface that is vertically offset from a top surface of the metal structure and further has a lower portion cupped by the metal structure; and
    an intermediate metal layer disposed between the high-κ gate dielectric structure and the metal structure, wherein outer sidewalls of the intermediate metal layer are aligned with outer sidewalls of the metal structure;
    wherein the first dielectric layer extends along opposing sidewalls of the second dielectric layer and cups a bottom surface of the second dielectric layer, and wherein the first dielectric layer is laterally offset from the intermediate metal layer by a non-zero distance.

2. The semiconductor device of claim 1, wherein the bottom surface of the second dielectric layer is vertically below a bottom surface of the intermediate metal layer by a second non-zero distance.

3. The semiconductor device of claim 1, the gate structure further comprising:
    a silicide layer overlying the gate body layer, wherein the silicide layer defines the top surface of the gate structure;
    wherein the gate body layer comprises polysilicon.

4. The semiconductor device of claim 3, wherein the silicide layer continuously extends from the top surface of the gate structure to a point below the top surface of the metal structure.

5. The semiconductor device of claim 1, wherein the gate body layer comprises intrinsic polysilicon.

6. The semiconductor device of claim 1, wherein outermost sidewalls of the gate body layer are in direct contact with inner sidewalls of the metal structure.

7. The semiconductor device of claim 1, wherein the first dielectric layer is U-shaped.

8. A semiconductor device comprising:
a pair of source/drain regions in a semiconductor substrate;
a high-κ gate dielectric structure overlying the semiconductor substrate, wherein the high-κ gate dielectric structure is laterally between and borders the source/drain regions;
a gate structure overlying the high-κ gate dielectric structure, wherein the gate structure comprises a gate body layer and a silicide layer that are stacked, wherein the gate structure further comprises a work function structure wrapping around a bottom of the gate body layer and extending along sidewalls of the gate body and silicide layers to a top surface of the work function structure, and wherein the top surface of the work function structure is about even with a top surface of the silicide layer;
wherein the pair of source/drain regions and the gate body layer have a first doping type that is n-type, and wherein the work function structure comprises n-type work function metals; and
a sidewall spacer surrounding sidewalls of the high-κ gate dielectric structure and the gate structure, wherein the sidewall spacer comprises an inner dielectric layer and a first dielectric layer, wherein the inner dielectric layer contacts a sidewall of the high-κ gate dielectric structure, wherein the first dielectric layer comprises a first vertical dielectric segment disposed along a sidewall of the inner dielectric layer and a lateral dielectric segment extending from the first vertical dielectric segment to the pair of source/drain regions, wherein a bottom surface of the inner dielectric layer is aligned with a bottom surface of the lateral dielectric segment, wherein the first dielectric layer comprises a second vertical dielectric segment, and wherein the sidewall spacer further comprises a second dielectric layer disposed laterally between the first and second vertical dielectric segments and along a top surface of the lateral dielectric segment.

9. The semiconductor device of claim 8, wherein the outermost sidewalls of the gate body layer and the outermost sidewalls of the silicide layer are aligned and directly contact inner sidewalls of the work function structure.

10. The semiconductor device of claim 8, wherein a thickness of the gate body layer is greater than a thickness of the silicide layer by a factor of three or more.

11. The semiconductor device of claim 8, wherein the work function structure is U-shaped.

12. The semiconductor device of claim 8,
wherein a top surface of the sidewall spacer is substantially aligned with the top surface of the silicide layer.

13. The semiconductor device of claim 8, wherein the gate body layer comprises intrinsic polysilicon.

14. The semiconductor device of claim 8, wherein the work function structure comprises three U-shaped metal layers.

15. The semiconductor device of claim 14, wherein the three U-shaped metal layers each comprise metal materials different from one another.

16. The semiconductor device of claim 8, wherein the bottom surface of the lateral dielectric segment is vertically below a top surface of the pair of source/drain regions.

17. A semiconductor device comprising:
a gate dielectric structure overlying a semiconductor substrate;
a sidewall spacer disposed on opposing sides of the gate dielectric structure, wherein the sidewall spacer comprises a first spacer dielectric layer and a second spacer dielectric layer;
a pair of source/drain regions in the semiconductor substrate and disposed on opposing sides of the gate dielectric structure; and
a gate structure overlying the gate dielectric structure and spaced between inner sidewalls of the sidewall spacer, wherein the gate structure comprises a silicide layer, a gate body layer, and a U-shaped metal structure, wherein the silicide layer overlies the gate body layer, wherein the U-shaped metal structure cups an underside of the gate body layer and has a top surface aligned with a top surface of the sidewall spacer and a top surface of the silicide layer;
wherein the first spacer dielectric layer contacts a sidewall of the U-shaped metal structure, wherein the second spacer dielectric layer continuously laterally extends from the first spacer dielectric layer to the pair of source/drain regions, and wherein the second spacer dielectric layer is U-shaped.

18. The semiconductor device of claim 17, further comprising:
an intermediate metal layer disposed between a top surface of the gate dielectric structure and a bottom surface of the U-shaped metal structure.

19. The semiconductor device of claim 17, wherein the gate body layer comprises doped polysilicon and forms an ohmic contact with the U-shaped metal structure and the silicide layer.

20. The semiconductor device of claim 17, wherein the second spacer dielectric layer directly contacts a sidewall of a first source/drain region in the pair of source/drain regions.

* * * * *